US006864165B1

(12) United States Patent
Pogge et al.

(10) Patent No.: US 6,864,165 B1
(45) Date of Patent: *Mar. 8, 2005

(54) METHOD OF FABRICATING INTEGRATED ELECTRONIC CHIP WITH AN INTERCONNECT DEVICE

(75) Inventors: H. Bernhard Pogge, Hopewell Junction, NY (US); Chandrika Prasad, Wappingers Falls, NY (US); Roy Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/605,204

(22) Filed: Sep. 15, 2003

(51) Int. Cl.[7] .......................... H01L 21/44; B23K 31/02
(52) U.S. Cl. ................ 438/612; 228/179.1; 228/180.22
(58) Field of Search ................................ 438/597, 598; 228/179.1

(56) References Cited

U.S. PATENT DOCUMENTS

| | | |
|---|---|---|
| 4,670,770 A | 6/1987 | Tai |
| 4,783,695 A | 11/1988 | Eichelberger et al. |
| 4,884,122 A | 11/1989 | Eichelberger et al. |
| 4,933,042 A | 6/1990 | Eichelberger et al. |
| 4,949,148 A | 8/1990 | Bartelink |
| 5,019,535 A | 5/1991 | Wojnarowski et al. |
| 5,353,498 A | 10/1994 | Fillion et al. |
| 5,373,627 A | 12/1994 | Grebe |
| 5,998,868 A | 12/1999 | Pogge et al. |
| 6,025,638 A | 2/2000 | Pogge et al. |
| 6,066,513 A | 5/2000 | Pogge et al. |
| 6,087,199 A | 7/2000 | Pogge et al. |
| 6,110,806 A | 8/2000 | Pogge |
| 6,281,452 B1 * | 8/2001 | Prasad et al. ................ 174/262 |
| 6,444,560 B1 | 9/2002 | Pogge et al. |
| 6,599,778 B2 * | 7/2003 | Pogge et al. ................ 438/118 |
| 6,600,224 B1 * | 7/2003 | Farquhar et al. ............ 257/731 |
| 6,737,297 B2 * | 5/2004 | Pogge et al. ................ 438/107 |
| 2002/0020924 A1 | 2/2002 | Mueller et al. |

OTHER PUBLICATIONS

"Novel microelectronic packaging method for reduced thermomechanical stresses on low dielectric constant materials", Emery et al., Intel Corp.

"Bridging the chip/package process divide", Pogge et al., IBM Microelectronics.

* cited by examiner

Primary Examiner—Alonzo Chambliss
(74) Attorney, Agent, or Firm—Jay H. Anderson (57) ABSTRACT

A method is described for forming an integrated structure, including a semiconductor device and connectors for connecting to a motherboard. A first layer is formed on a plate transparent to ablating radiation, and a second layer on the semiconductor device. The first layer has a first set of conductors connecting to bonding pads, which are spaced with a first spacing distance in accordance with a required spacing of connections to the motherboard. The second layer has a second set of conductors connecting to the semiconductor device. The first layer and second layer are connected using a stud/via connectors having spacing less than that of the bonding pads. The semiconductor device is thus attached to the first layer, and the first set and second set of conductors are connected through the studs. The interface between the first layer and the plate is ablated by ablating radiation transmitted through the plate, thereby detaching the plate. The connector structures are then attached to the bonding pads. This method permits fabrication of a high-density packaged device with reduced cost.

16 Claims, 14 Drawing Sheets

METHOD OF FABRICATING INTEGRATED ELECTRONIC CHIP WITH AN INTERCONNECT DEVICE

BACKGROUND OF INVENTION

This invention relates to the manufacture of electronic device modules which include high-performance semiconductor devices (including CMOS logic devices, DRAM memory devices and the like) and interconnections between those devices. In particular, the invention relates to fabrication of high-density chip interconnections with improved reliability and reduced cost.

Electronic devices are continuing to become more complex with each generation, while at the same time their respective device elements are becoming smaller. This trend toward greater device density and complexity presents special challenges for the device packaging technologist. Semiconductor devices at present are manufactured with either wire bond pads or C4 pads to connect such devices to the next level interconnect; this is generally termed the first level of packaging.

The packaging sector has for a number of years represented the primary constraint on improving system speed for many semiconductor chip technologies. At the same time, the packaging of a device represents a high proportion of the total cost; recent cost modeling indicates that the cost of the packaging may account for as much as 80% of the total cost for leading edge devices.

Figure 1A:
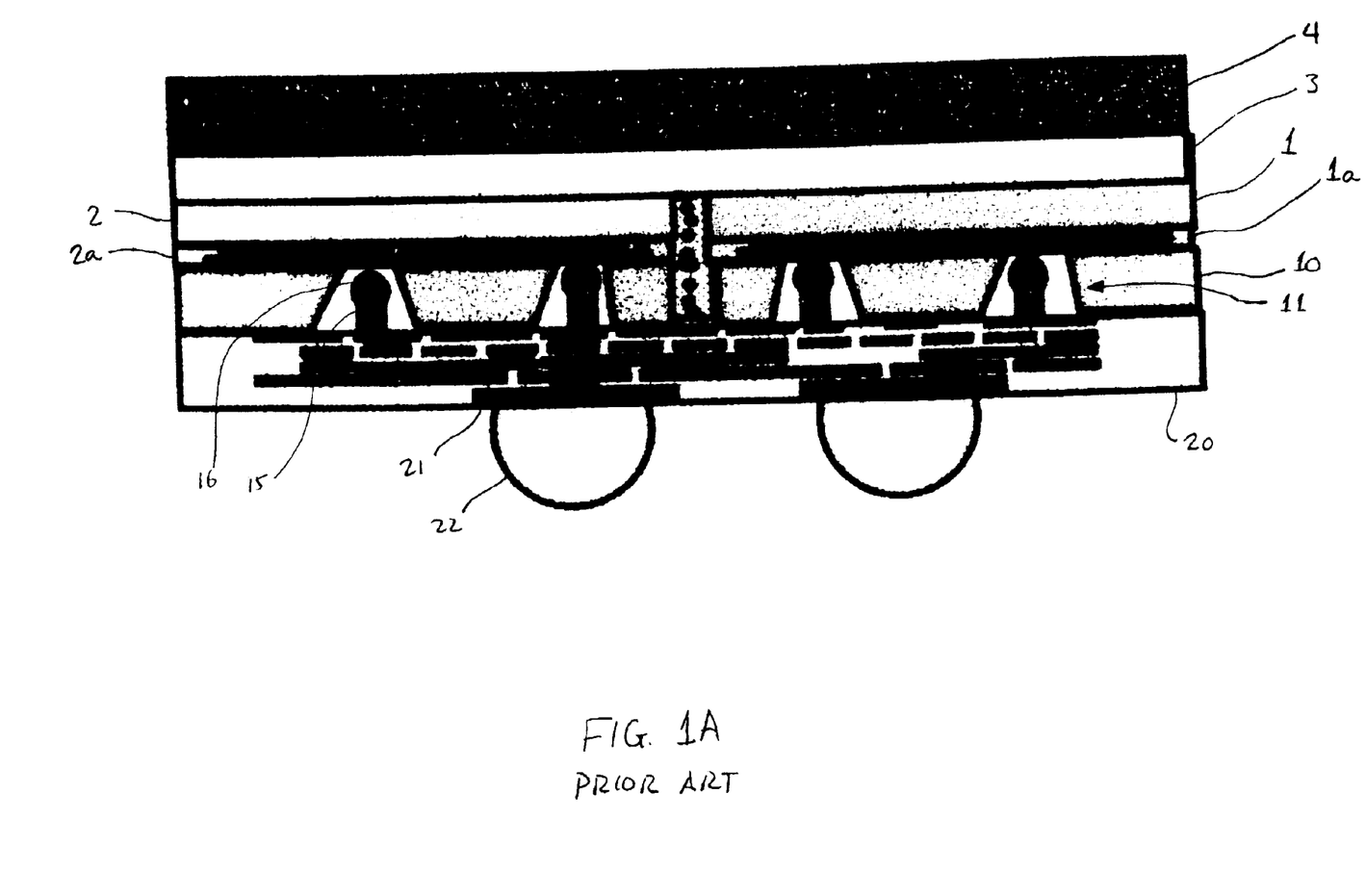
FIG. 1A is a schematic cross-sectional view of interconnected chips using previously described T&J methodology, with C4 connection to the first level of packaging.

An example of a complex, large-scale chip which presents a challenge for packaging technology is the system-on-a-chip (SOC) which includes multiple interconnected chips having different functions. A large SOC may be fabricated from separate processor or memory chips using a transfer and join (T&J) method in which chip-to-chip interconnections are made through a thin film to which multiple chips are bonded. An example of this methodology is shown in FIG. 1A. A thin film structure having interconnect wiring is fabricated on a glass wafer or plate. Chips 1 and 2, coated with thin films having wiring levels 1a and 2a respectively, are bonded to interconnect layer 20 using stud/via connections. In this example, studs 15 are formed on the interconnect layer and attach to the chips using solder connections 16. The studs are aligned to vias 11 formed in a layer 10 (typically polyimide) overlying the chips. The back sides of chips 1 and 2 are planarized and are coated with an adhesive layer 3, to which a backing wafer 4 is attached. The glass wafer or plate is removed from interconnect layer 20, leaving behind the interconnect wiring with the bonded chips. Electrical bonding pads 21 are formed on the chip-to-chip interconnect layer 20, and have C4 pads 22 formed thereon. Details of the T&J process are discussed in U.S. Pat. No. 6,444,560, the disclosure of which is incorporated herein by reference.

Figure 1B:
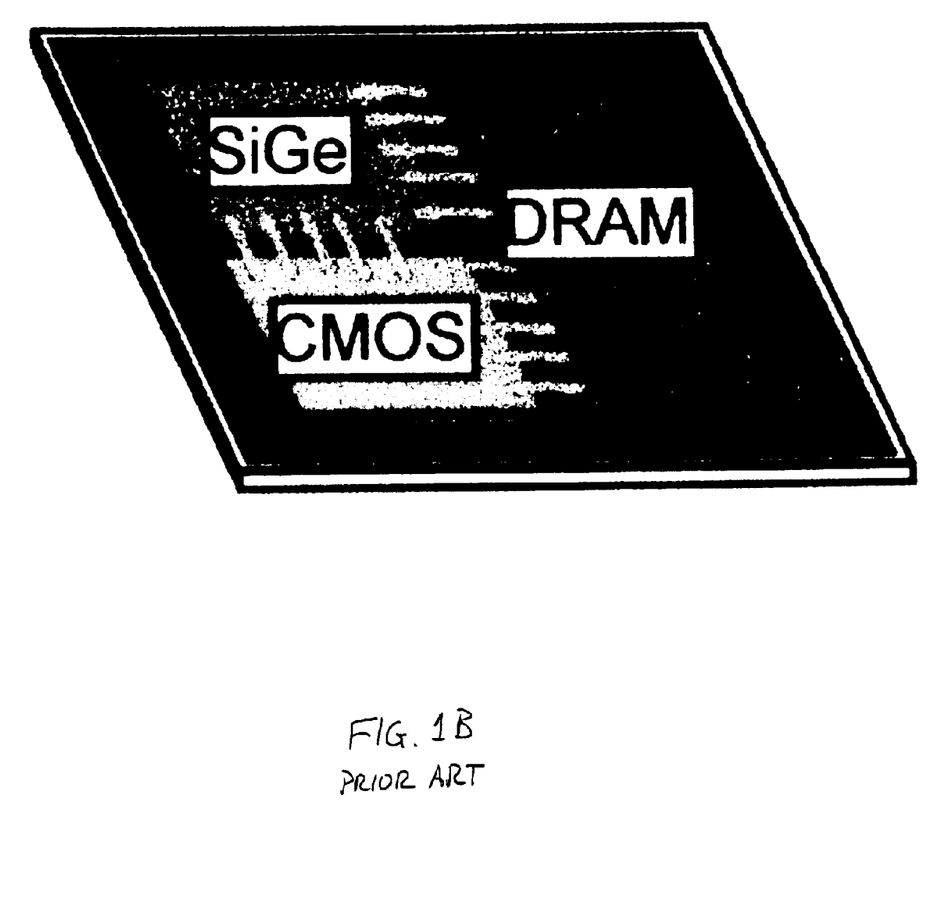
FIG. 1B is a schematic view of a system-on-a-chip (SOC) fabricated in accordance with the T&J methodology of FIG. 1A.

Chip-to-chip placements with the above-described T&J methodology may be as close as 25 μm to 60 μm, with a placement accuracy of about 1 μm. It is noteworthy that chips 1 and 2 may have different functions and be fabricated by different processes. The T&J method thus permits fabrication of a system-on-a-chip in which different devices are closely interconnected (see FIG. 1B).

The use of C4 pads or wirebond pads for connecting the SOC to a motherboard imposes practical limits on the wiring density and bandwidth of the packaged device, due to the spacing requirements of the pads (a typical C4 pitch is at least 150 μm, and generally ranges from 0.5 mm to 2.5 mm). Furthermore, each C4 connection represents a signal delay of about 50 psec.

It therefore is desirable to extend the above-described T&J methodology from a chip-to-chip interconnection scheme to a chip-to-package integration technology, in order to (1) permit more efficient packaging of high-density devices and (2) fabricate a device module with reduced cost.

SUMMARY OF INVENTION

The present invention provides an integrated structure including a semiconductor device and connector structures for connecting the semiconductor device to a motherboard, and a method for fabricating such a structure.

According to a first aspect of the invention, the method includes the steps of forming a first layer on a plate transparent to ablating radiation, and forming a second layer on the semiconductor device. The first layer has a first set of conductors disposed therein; the first set of conductors connect to bonding pads, which are spaced with a first spacing distance in accordance with a required spacing of connections to the motherboard. The second layer has a second set of conductors disposed therein which connect to the semiconductor device. Studs are then formed on one of the first layer and the second layer, and a third layer is formed on the other of the first layer and the second layer; the studs are spaced with a second spacing distance less than the first spacing distance. Vias are formed in the third layer, likewise spaced in accordance with the second spacing distance. The studs are then aligned to the vias, and the semiconductor device is attached to the first layer, so that the first set of conductors and the second set of conductors are connected through the studs. The method also includes the step of ablating an interface between the first layer and the plate using ablating radiation transmitted through the plate, thereby detaching the plate. The connector structures are then attached to the bonding pads. The connector structures form one of a pin grid array (PGA), a ball grid array (BGA), a C4 array and a land grid array (LGA).

A support structure or stiffener is preferably attached to the first layer, so that the support structure surrounds the semiconductor device; the support structure may be attached either before or after the semiconductor device is attached to the first layer. The support structure has an area corresponding to an area occupied by the bonding pads. The support structure advantageously has a thermal coefficient of expansion (TCE) approximately that of the motherboard. The gap between the semiconductor device and the support structure is filled with an organic fill material. It is noteworthy that the second set of conductors is typically a plurality of BEOL metal layers; the number of these metal layers is less than a number of layers required for fanout to the bonding pads spaced with the first spacing distance.

According to a second aspect of the invention, a similar method is provided with the connectors between the first layer and the second layer being C4 connectors. Accordingly, in addition to the gap between the semiconductor device and the stiffener there is a gap between the semiconductor device and the first layer surrounding the C4 connectors, which is likewise filled with a fill material.

According to an additional aspect of the invention, an integrated structure is provided which includes a semiconductor device and connector structures for connecting the semiconductor device to a motherboard. Furthermore, the integrated structure includes a first layer having a first set of conductors disposed therein; the first set of conductors connect to bonding pads disposed on the lower surface of the layer. The bonding pads are spaced with respect to each other with a first spacing distance in accordance with a required spacing of connections to the motherboard. A second layer, facing the first layer, is disposed on the semiconductor device and in contact therewith; the second layer has a second set of conductors disposed therein connecting to the semiconductor device. A plurality of connectors connect the first set of conductors to the second set of conductors; these conductors are either a set of stud/via connectors or a set of C4 connectors. These connectors are spaced with respect to each other with a second spacing distance less than the first spacing distance. A support structure or stiffener is attached to the upper surface of the first layer and surrounds the semiconductor device, and a gap between the support structure and the semiconductor device is filled with a fill material. The connector structures are connected to the bonding pads; these connector structures may form a pin grid array (PGA), a ball grid array (BGA), a C4 array or a land grid array (LGA).

DETAILED DESCRIPTION

In accordance with the present invention, T&J techniques are used to reduce the number of required BEOL metal layers on individual chips, while providing efficient and cost-effective interconnections from chip to chip and between the chips and the next level of packaging.

First Embodiment: Chip Join to Wiring Layer Using Stud/Via Connections

Figure 2A:
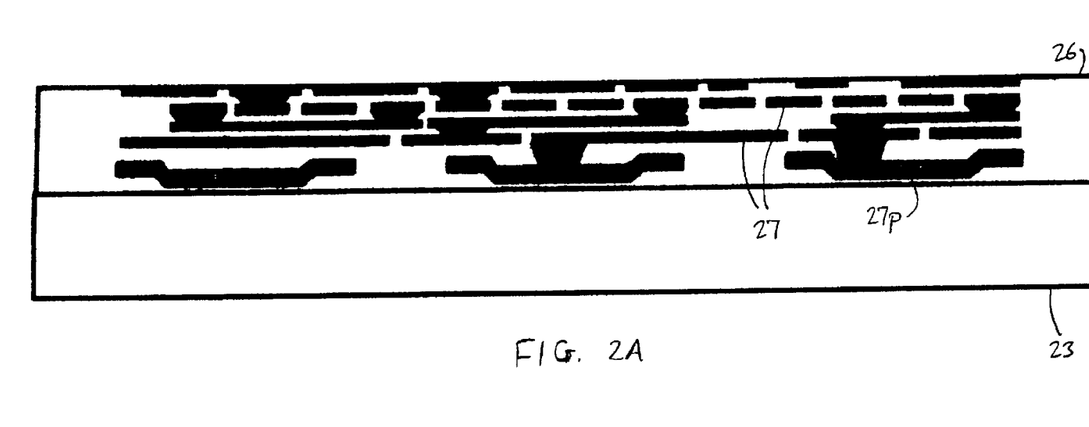
FIG. 2A is a schematic cross-sectional view of an interconnect wiring layer formed on a glass substrate, in accordance with a first embodiment of the invention.

The interconnect wiring 27 (preferably Cu) is embedded in a dielectric layer 26 (typically polyimide or an oxide) on a transparent substrate 23 (see FIG. 2A). Substrate 23 is typically made of glass such as boro-float glass and has a size of 200 mm in diameter, commensurate with wafer sizes used in manufacturing. Although layer 26, including conductors 27, is shown as a single layer, it will be appreciated that for ease of manufacturing it is often designed and fabricated as a multilayer structure. The number of levels of wiring in layer 26 depends on the connection density required to match with the chip connections; typically 3 to 5 metal layers are required. The Cu conductors 27 connect to bonding pads 27p which typically are formed of Ni (but may also be Cu, Au, Co or a combination thereof). The bonding pads 27p have a spacing in accordance with a required spacing of connections to a motherboard. For example, if conductors 27 are to be connected (at a later stage of the process) to a motherboard using C4 technology where the C4 connectors are required to be at least 0.5 mm apart, the spacing of pads 27p is likewise 0.5 mm. As shown in FIG. 2A, a thin layer of dielectric material may be provided to cover pads 27p and thus separate the pads from the substrate 23.

Figure 2B:
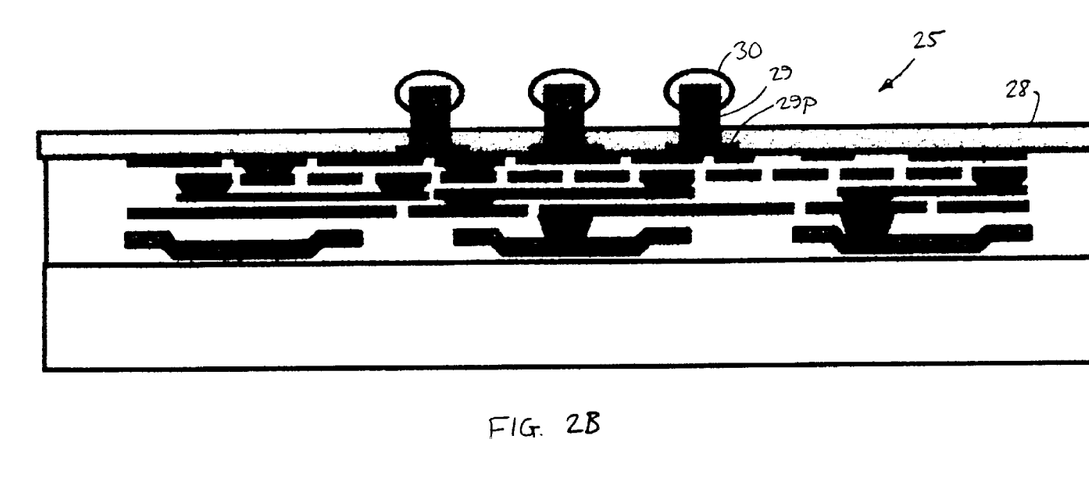
FIG. 2B is a schematic cross-sectional view of studs formed on the wiring layer of FIG. 2A, to connect the wiring layer to a chip.

An alignment structure 25 is formed on the top of wiring layer 26, to make physical and electrical connection to the chips (see FIG. 2B). In this embodiment, the alignment structure has studs formed on the interconnect wiring layer for alignment to vias formed on another layer overlying the chips. Connector pads 29p are formed to connect to the top level of Cu wiring. Pads 29p have studs 29 formed thereon; the studs may be formed of Ni, Cu, Ni-plated Cu, W or some other metal or combination of metals. The top surface of wiring layer 26 is coated with a layer 28 of thermoplastic polymer adhesive layer; studs 29 protrude from this layer. Layer 28 serves as an adhesive for subsequent bonding of the chips to wiring layer 26. A layer 30 of low-melting-point alloy material is formed on the surface of each stud 29; this facilitates formation of an electrical connection during the chip joining process. This material is typically 90/10 Pb/Sn solder, 2 Fm or less thick; alternative alloy materials include Au/Sn and Sn/Ag. The alloy material may be subjected to a thermal reflow process so that layer 30 acquires a rounded shape, as shown in FIG. 2B; this facilitates alignment of the studs to the via structure formed on the chips.

Figure 3A:
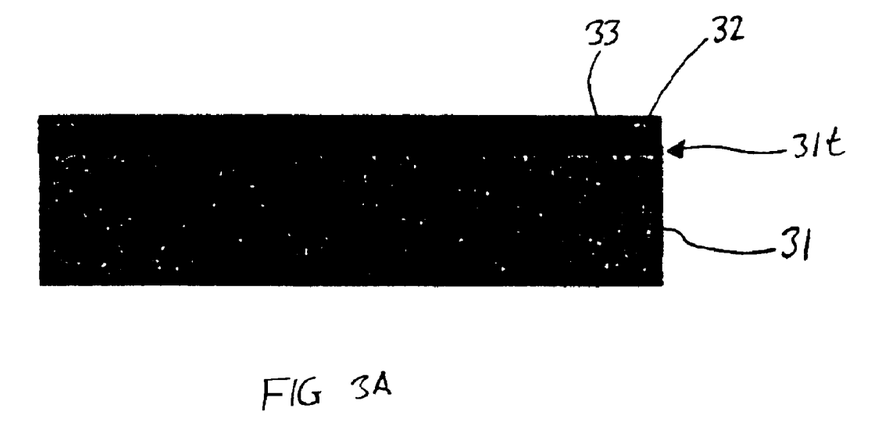
FIG. 3A is a schematic cross-sectional view of a chip with back-end-of-the-line (BEOL) metal layers formed thereon, in accordance with the invention.

Chips 31 are fabricated according to processes known in the art. Metal wiring layers 33 (embedded in and surrounded by dielectric layers 32) are formed at the top surface 31t of the chip, as is understood in the art. These wiring layers are generally referred to as backend-of-the-line or BEOL layers. In contrast to the present state of the art, it is not necessary to build BEOL layers which fan out to the reduced areal density of C4 pads or wirebond pads to connect to the chip package; as described in more detail below, connections between chips and package in the present embodiment are made without using C4s or wirebond pads. Accordingly, the number of required BEOL metal layers 33 is generally reduced from 6 or 7 (the number typically required for such fanout) to 3 or 4 (see FIG. 3A). This has the effect of improving chip yield and reducing chip processing cost.

Figure 3B:
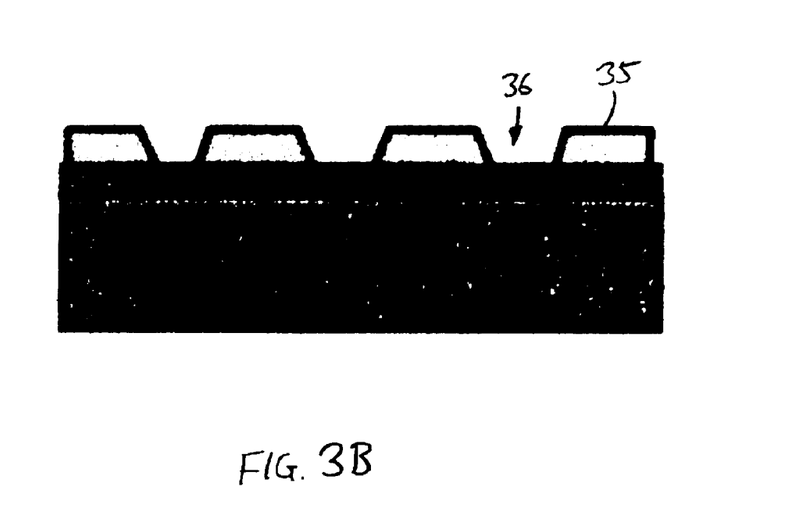
FIG. 3B is a schematic cross-sectional view of the chip of FIG. 3A, with an additional layer having vias formed therein, for alignment to the studs on the wiring layer of FIG. 2A.

The last metal layer is covered by a dielectric layer 35 (see FIG. 3B). Layer 35 is typically a polyimide material used in thin film packaging processing. Layer 35 has vias 36 formed therein. As shown in FIG. 3B, the vias may be formed with a sloped wall angle as a guide for high-accuracy, self-aligned placement of the studs 29 in the vias 36. At the bottom of each via 36 is a conductor connecting to the metal layers beneath. The wall angle of the via may be tailored to be either near-vertical or sloped. The chips are typically fabricated at the wafer level up to this point, and then diced into individual chips for joining to the package.

It should be noted that the chips 31 (along with BEOL wiring 33) and the alignment structure 25 (along with interconnect wiring layer 26) may be processed in parallel. Since the number of BEOL metal wiring layers is reduced relative to the conventional chip packaging scheme, this also has the effect of improving processing throughput and reducing cost.

Figure 4A:
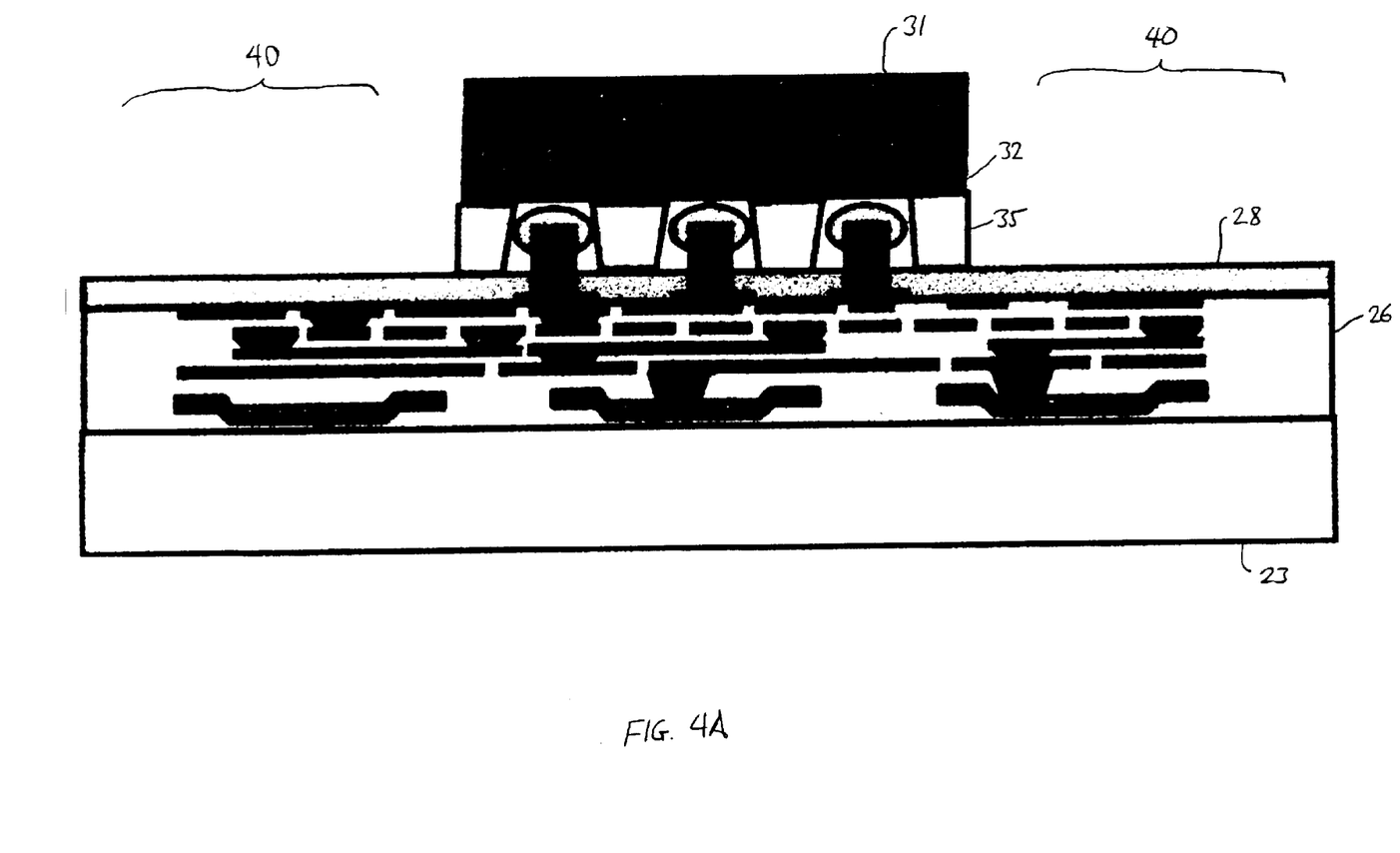
FIG. 4A shows a chip connected to an interconnect wiring layer, in accordance with the first embodiment of the invention.

Chip 31 is then aligned to the alignment structure so that studs 29 match vias 36, as shown in FIG. 4A. This alignment is preferably performed at a moderately elevated temperature so that adhesive layer 28 is slightly tacky before being brought into contact with the surface of layer 35. This prevents chip 31 from moving during the subsequent bonding operation.

Figure 4B:
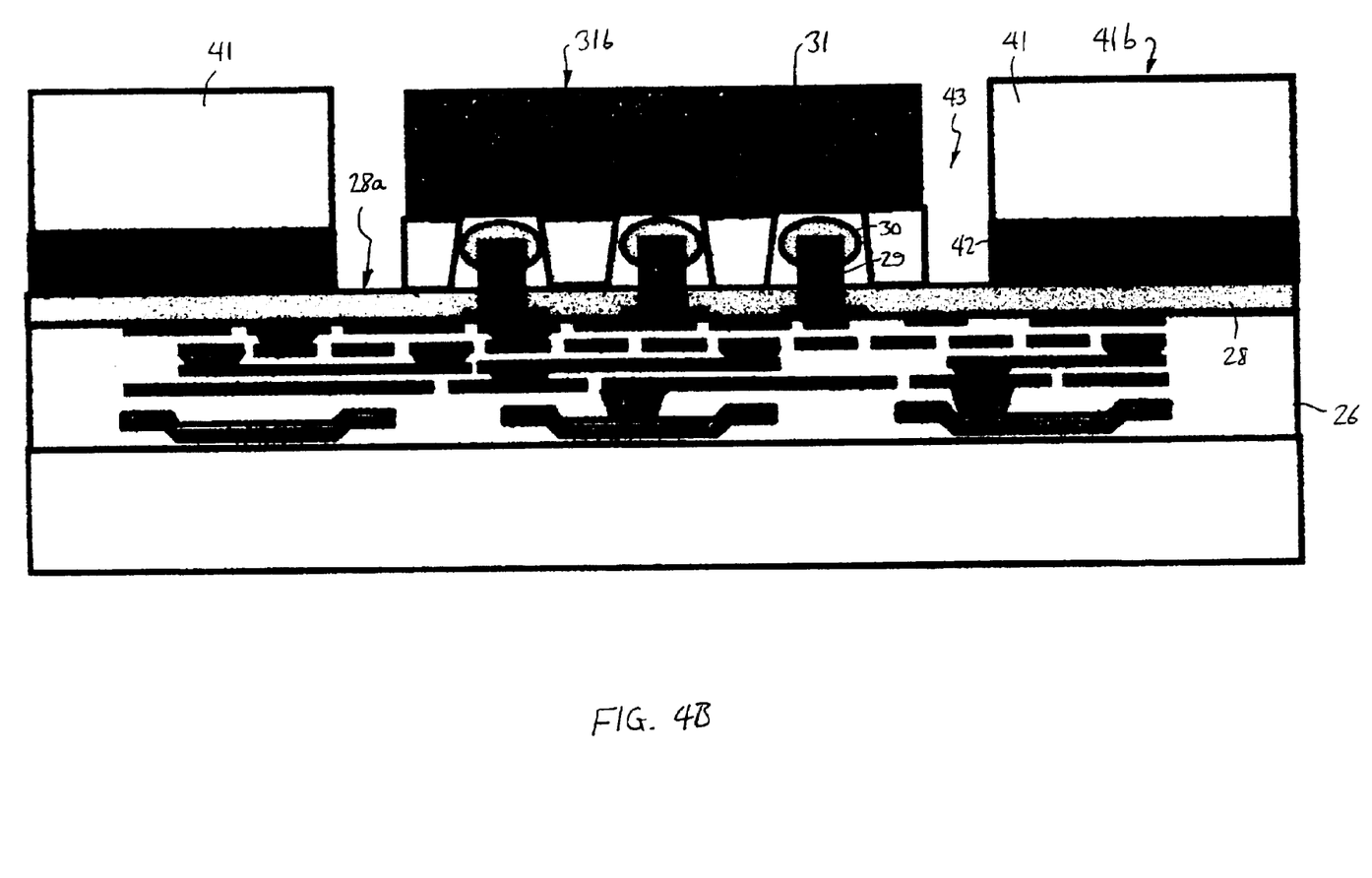
FIG. 4B shows the arrangement of FIG. 4A with stiffeners placed on the interconnect wiring layer, in accordance with the first embodiment of the invention.

As shown in FIG. 4A, the size of the interconnect area is generally larger than the chip area. This is due to the lower density of connections on the mother board, where the typical pitch for connectors ranges from 0.5 mm to 2.5 mm. The area 40 surrounding the chip is filled with a stiffener (or a plurality of stiffeners) likewise attached to the top of the thin film interconnect layer using adhesive layer 28. As shown in FIG. 4B, stiffener 41 has a hole in its center slightly larger than chip 31. Additional openings may be made in the stiffener to permit attachment of other devices (e.g. decoupling capacitors) on surface 28a, adjacent to chip 31. The stiffener has a layer 42 of thermoplastic polyimide or other adhesive formed on its top surface, and is then flipped over and attached to layer 28. The stiffener may be made of ceramic, metal or organic material; the selection of material for the stiffener will depend on mechanical strength and reliability requirements. It is also desirable that the stiffener material have a thermal coefficient of expansion (TCE) close to that of the motherboard. The thickness of stiffener 41 may be chosen so that the back surface 41b of the stiffener and the back surface 31b of the chip are at the same height, as shown in FIG. 4B. Alternatively, the stiffener may be made thicker, to better accommodate placement of thermal cooling solder, a thermally conductive compound or some other heat sink on surface 31b.

After placement on adhesive layer 28, chip 31 and stiffener 41 are bonded to the thin film interconnect structure (that is, substrate 23 with wiring layer 26 and adhesive layer 28 thereon) using a lamination process at elevated temperature and pressure. Depending on the particular materials used, bonding is performed at a temperature of 150° C. to 400° C., at a pressure of 10 to 200 psi. The bonding operation may be performed on the full-size glass substrate (the size of a typical wafer used in manufacturing, 200 mm to 300 mm in diameter) or with a smaller diced size (e.g. 100 mm to 300 mm square), depending on the design of the lamination process tool. The bonding operation causes solder 30 to flow and at least partially fill the via 36 and make an electrical connection to the BEOL metal layers 33. An electrical connection is thus formed from the chip 31, through metal layers 33, studs 29 and interconnect wiring 27, to bonding pads 27p.

The narrow gap 43 between the chip and the stiffener is then filled with an organic material (either a polyimide or an underfill material) to ensure that chip 31, stiffener 41 and wiring layer 26 form a rigid system.

Figure 4C:
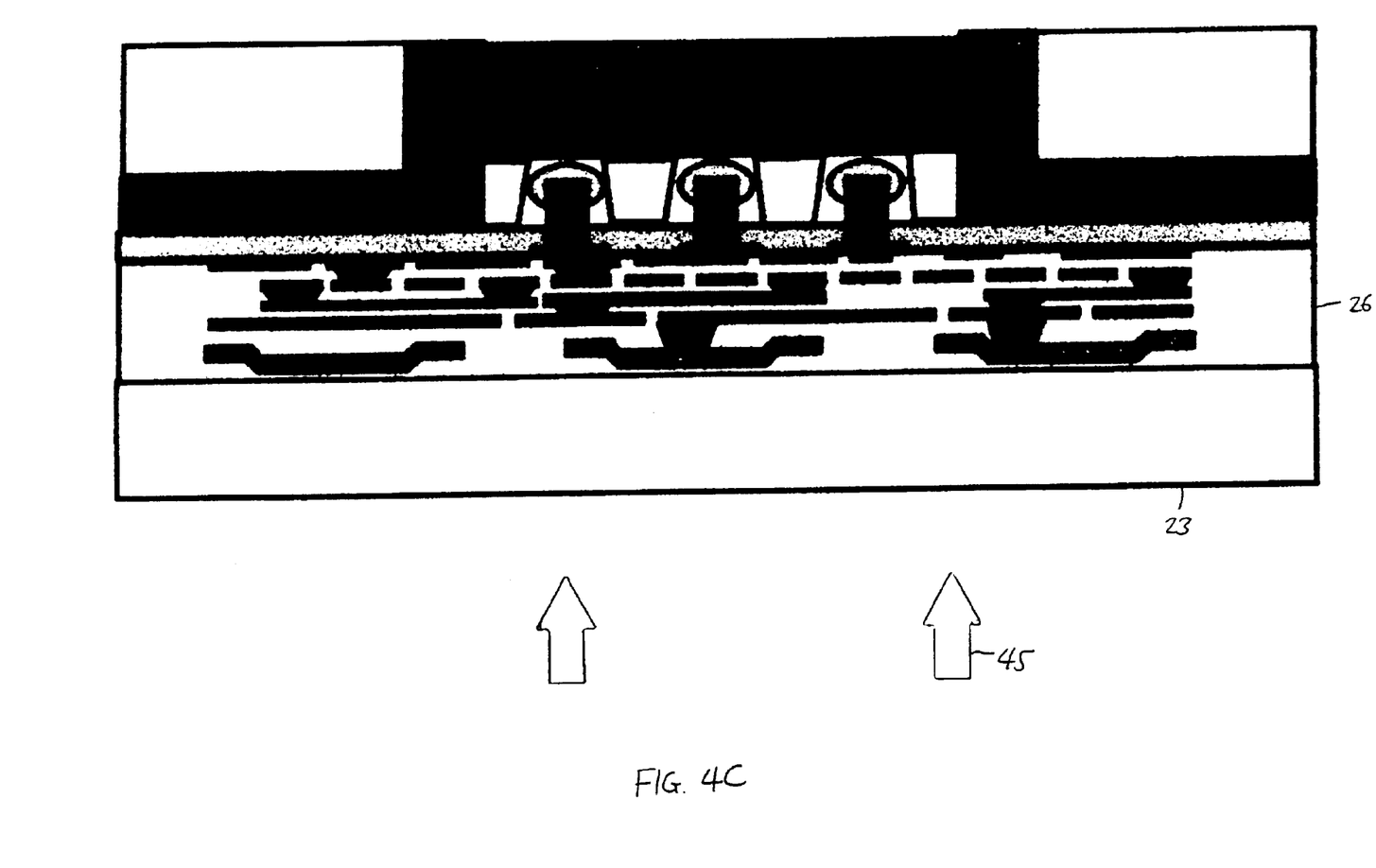
FIG. 4C is a schematic view of the ablation process by which the glass substrate is removed from the interconnect wiring layer.

The laminated structure is then subjected to a laser ablation process, as shown schematically in FIG. 4C. Laser radiation 45, incident on transparent plate 23, penetrates the plate and ablates the interface between the plate and layer 26. This results in delamination of the plate from layer 26, so that the plate may be removed. The pads 27p in the interconnect layer structure are then exposed by ashing or laser ablating any polyimide residue.

Figure 4D:
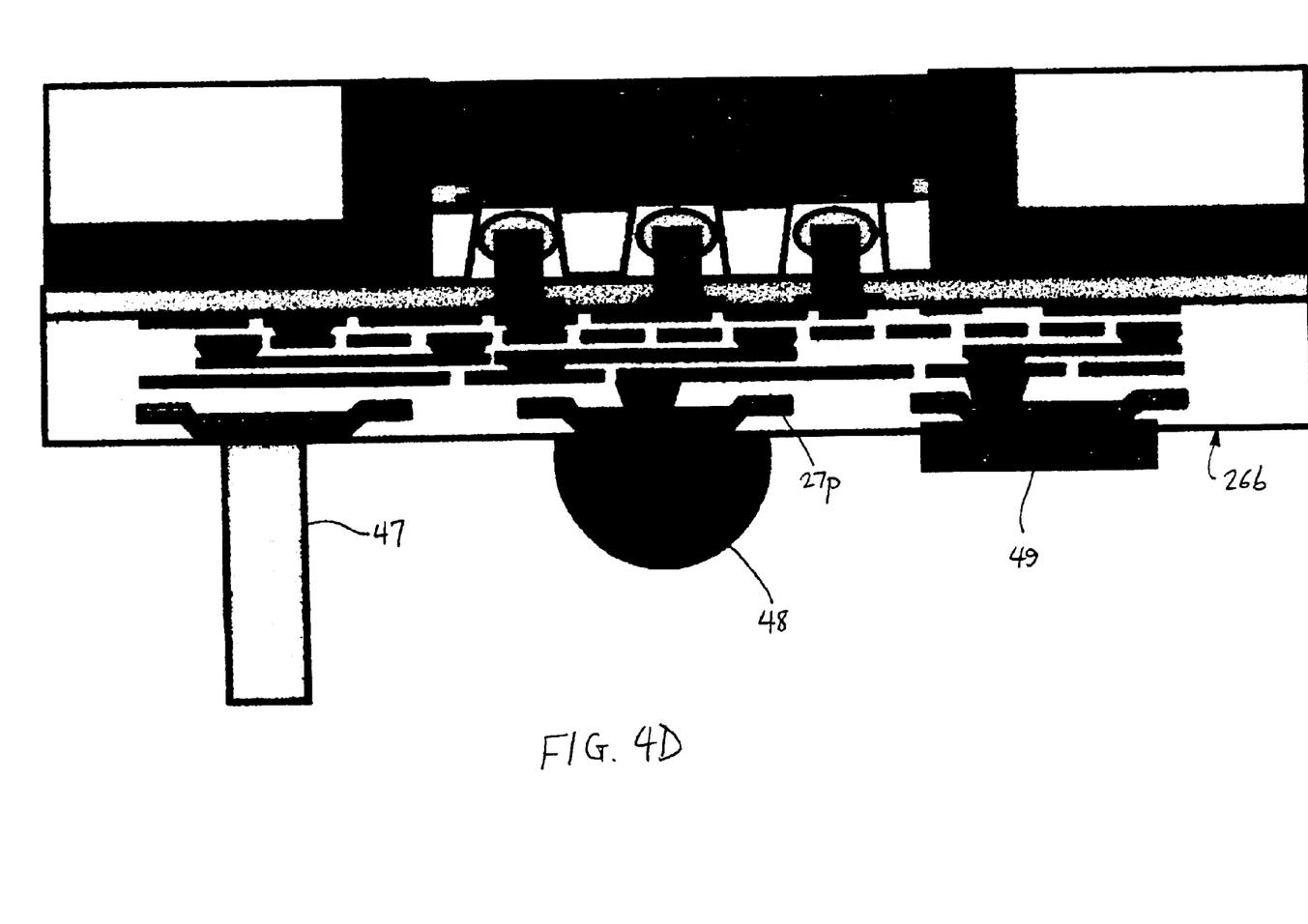
FIG. 4D is a schematic cross-sectional view of a completed integrated device in accordance with the invention.

After the pads are exposed, the chip/stiffener/interconnect structure is processed to yield modules for connection to a motherboard. The structure at this point is typically diced into individual modules and subjected to appropriate electrical tests. Connector metallurgy is then formed on pads 27p, as shown in FIG. 4D. The connectors may be in the form of pin grid array (PGA) pins 47, ball grid array (BGA) or C4 solder balls 48, or land grid array (LGA) structures 49. As noted above, space may be provided in stiffener openings, adjacent the chip 31, for decoupling capacitors or the like; accordingly, the entire bottom surface 26b of the interconnect layer is available for placement of connector structures 47, 48 or 49.

It should be noted that the completed structure, shown schematically in FIG. 4D, has both improved interconnection density and higher reliability compared with conventional arrangements. The connectors to the chip (in this embodiment, studs 29) have a typical pitch of 10 $\mu$m, compared to a pitch of 150 $\mu$m in current packaged devices. Furthermore, the C4 solder connection between chip and interconnect is eliminated, so that problems with C4 fatigue reliability are avoided. In addition, if the stiffener material is chosen to have its TCE match that of the motherboard, thermal stress reliability concerns are avoided.

It will be appreciated that a stud/via connection between chip 31 and interconnect wiring layer 26 may also be realized by reversing the positions of studs and vias shown in FIGS. 2B and 3B; that is, studs may be formed on the BEOL wiring layers of chip 31 while a polyimide layer with vias is formed on the interconnect wiring layer 26.

It should also be noted that transparent plate 23 may be of any convenient size and shape to accommodate the chips. For example, if each chip 31 is 25 mm square and located in the center of a stiffener 60 mm square, a 3×3 array of chips may be conveniently processed on a plate 200 mm square.

Figure 5:
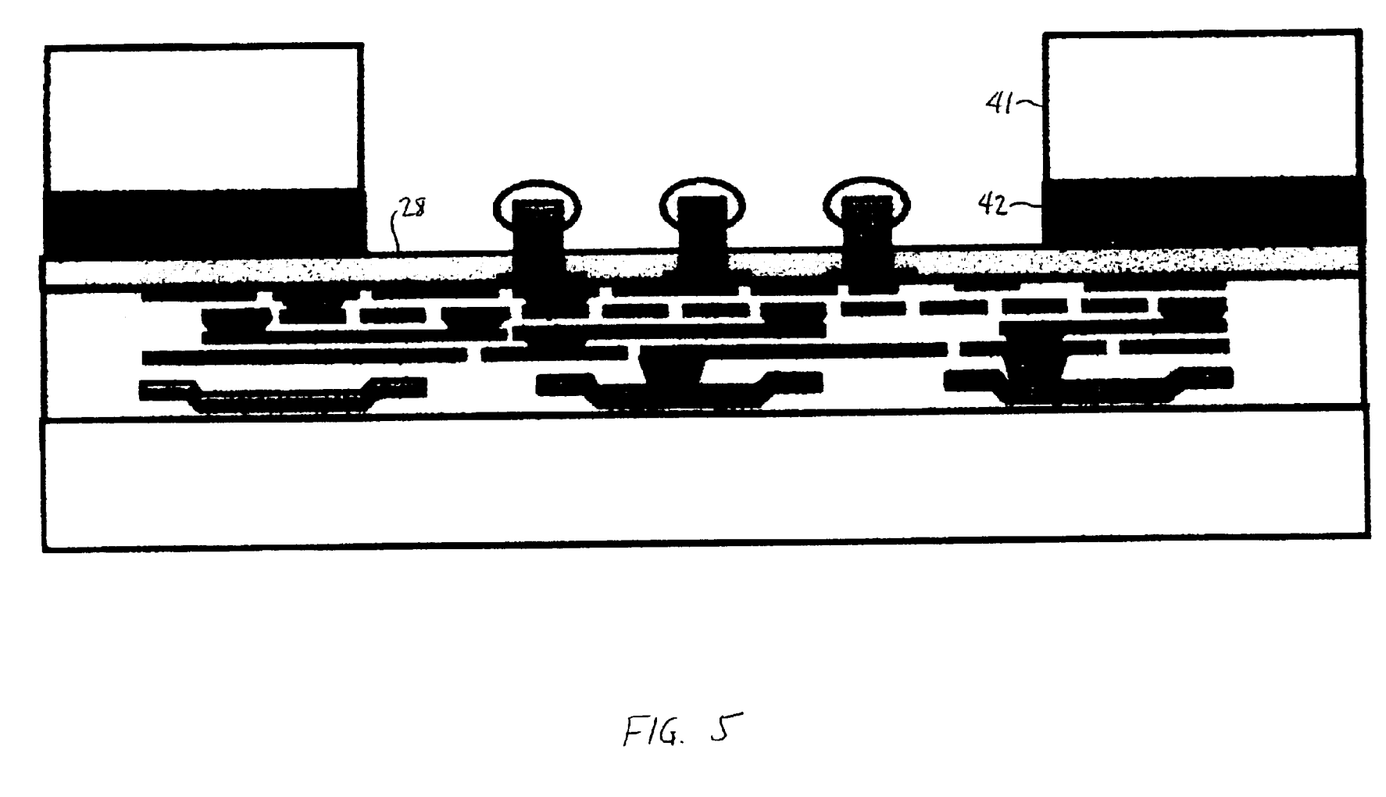
FIG. 5 is a schematic cross-sectional view of a substrate with a wiring layer, stiffeners and connection studs formed thereon, where the stiffener is attached before the chip is connected.

If it is desired to ensure that the interconnect layer is rigid before the chip is attached thereto, the stiffener 41 may be attached to adhesive layer 28 (using adhesive layer 42 applied to the stiffener) before the chip joining process, as shown in FIG. 5. chip is subsequently attached and bonded, and the plate 23 removed, as described above with reference to FIGS. 4A–4C, to yield the integrated structure shown in FIG. 4D.

Second Embodiment: Chip Join to Wiring Layer Using C4 Connections

Figure 6A:
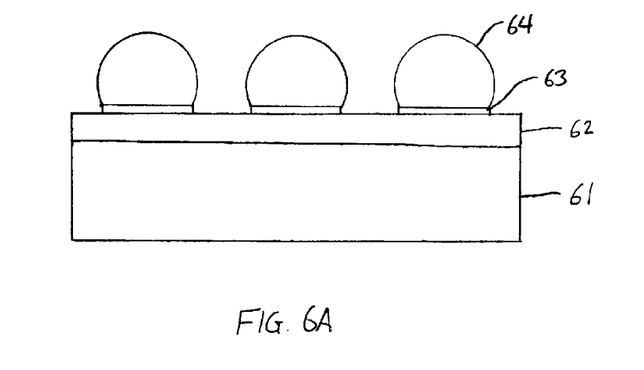
FIG. 6A is a schematic cross-sectional view of a chip with C4 connectors, in accordance with a second embodiment of the invention.
Figure 6B:
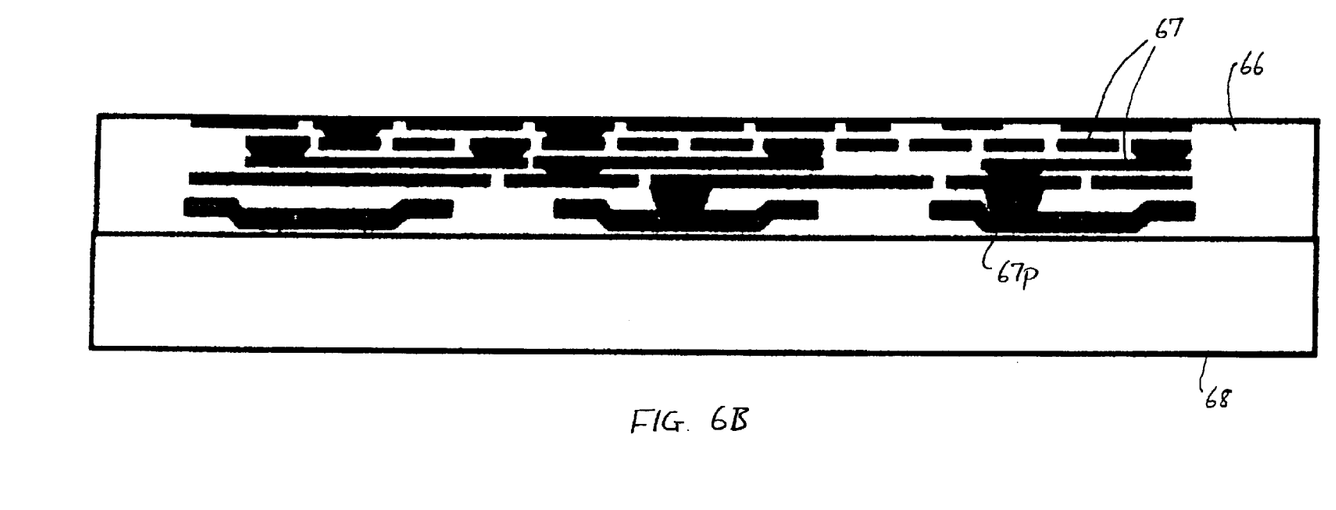
FIGS. 6B–6F illustrate steps in formation of an integrated device in accordance with the second embodiment of the invention.
Figure 6C:
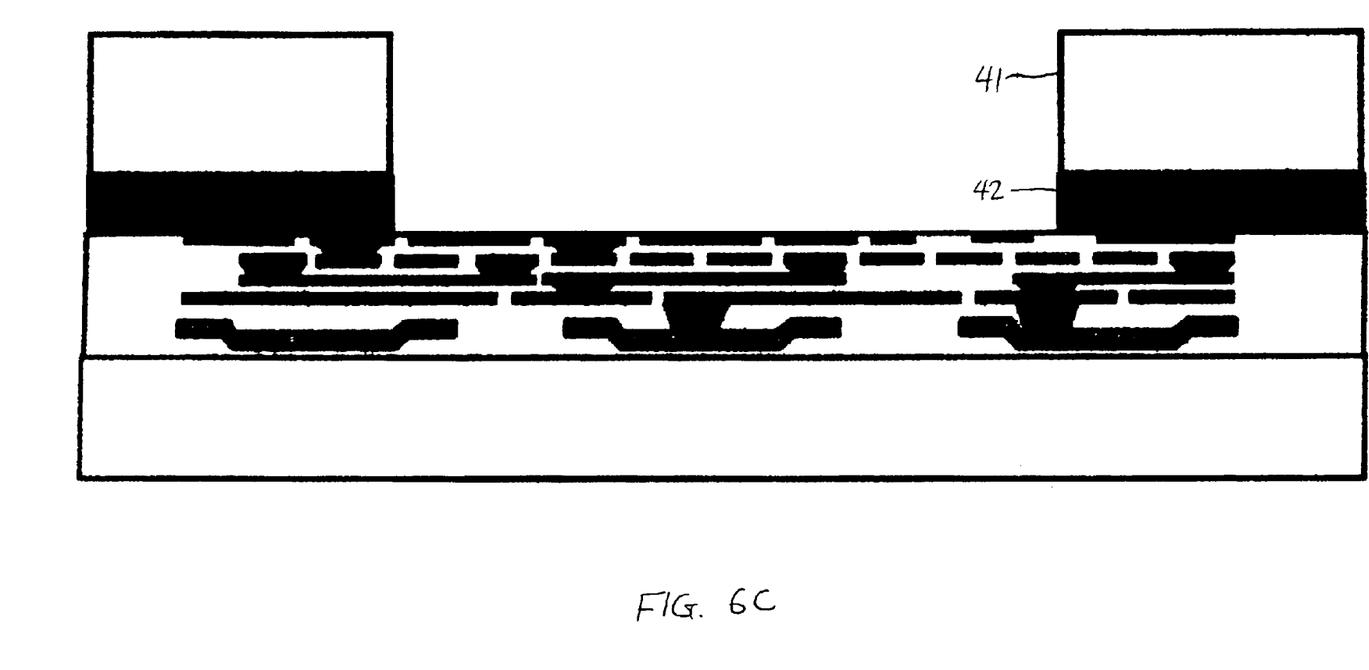

In this embodiment, the connection between chip 31 and interconnect wiring 27 is realized using conventional C4 connectors. As shown in FIG. 6A, chip 61 has BEOL metal wiring layers embedded in a dielectric layer 62, with the last metal layer connecting to pads 63 on which C4 solder balls 64 are formed. Interconnect wiring 67 (preferably Cu) is embedded in a dielectric layer 66 (typically polyimide or an oxide) on a transparent substrate 68. The interconnect wiring also connects to bonding pads 67p, as in the first embodiment (see FIG. 6B; compare FIG. 2A). A stiffener 41 is prepared with an adhesive layer 42 on the top thereof, then flipped over and joined to layer 66, to form the structure of FIG. 6C. As in the first embodiment, the stiffener has a hole in its center slightly larger than chip 61.

Figure 6D:
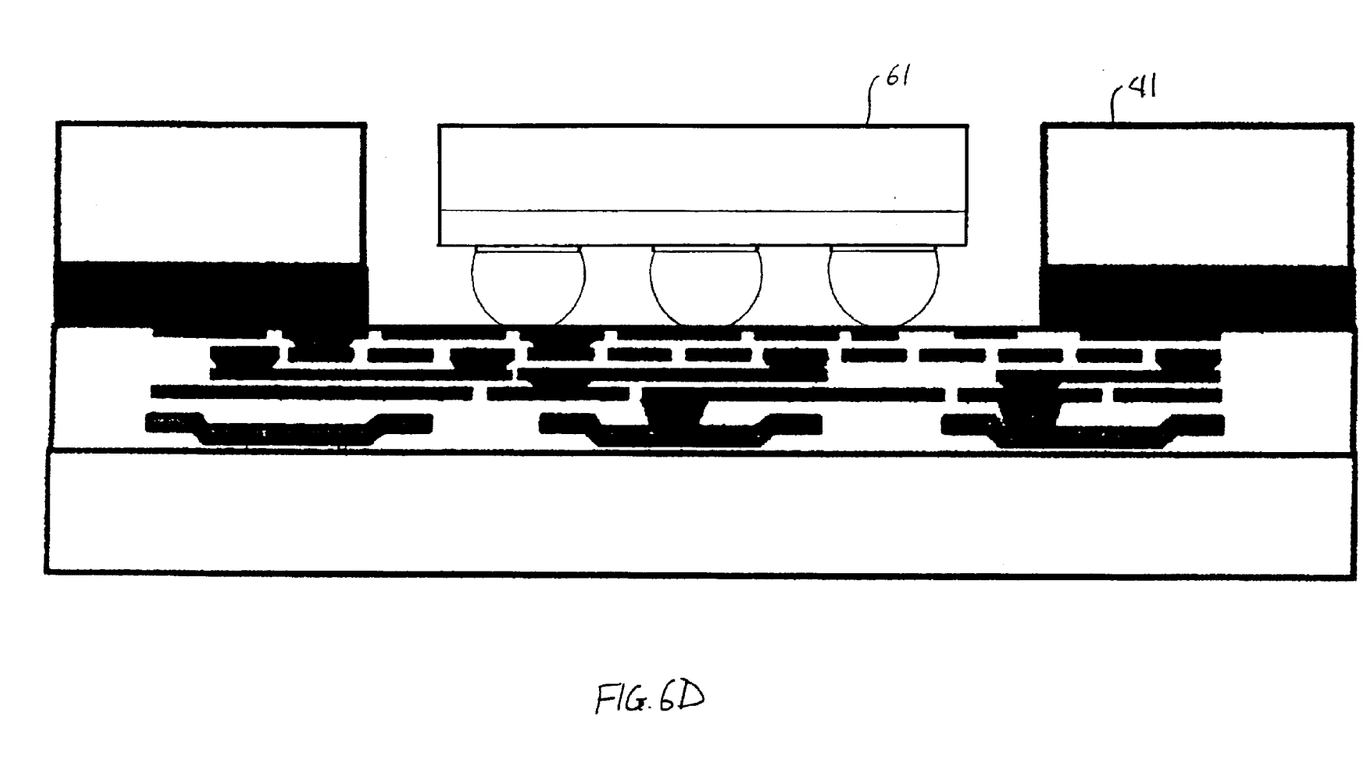
Figure 6E:
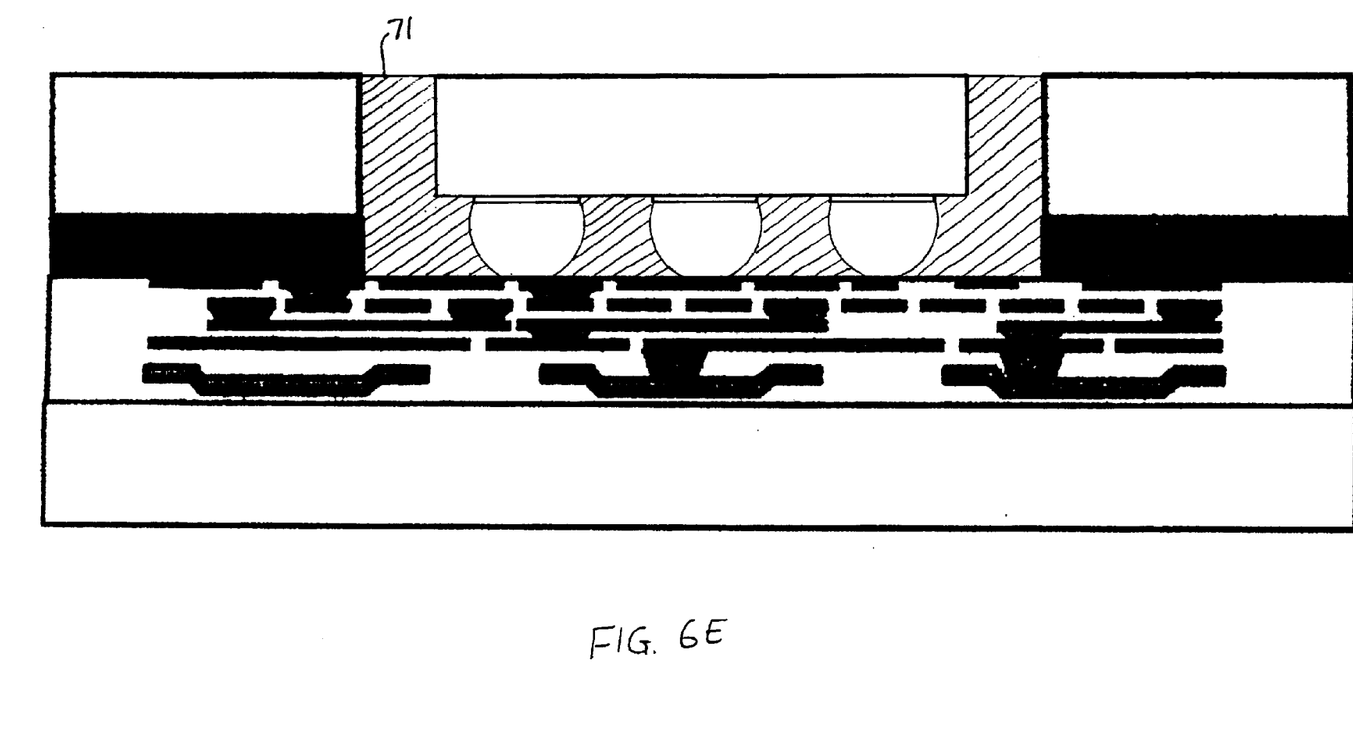
Figure 6F:
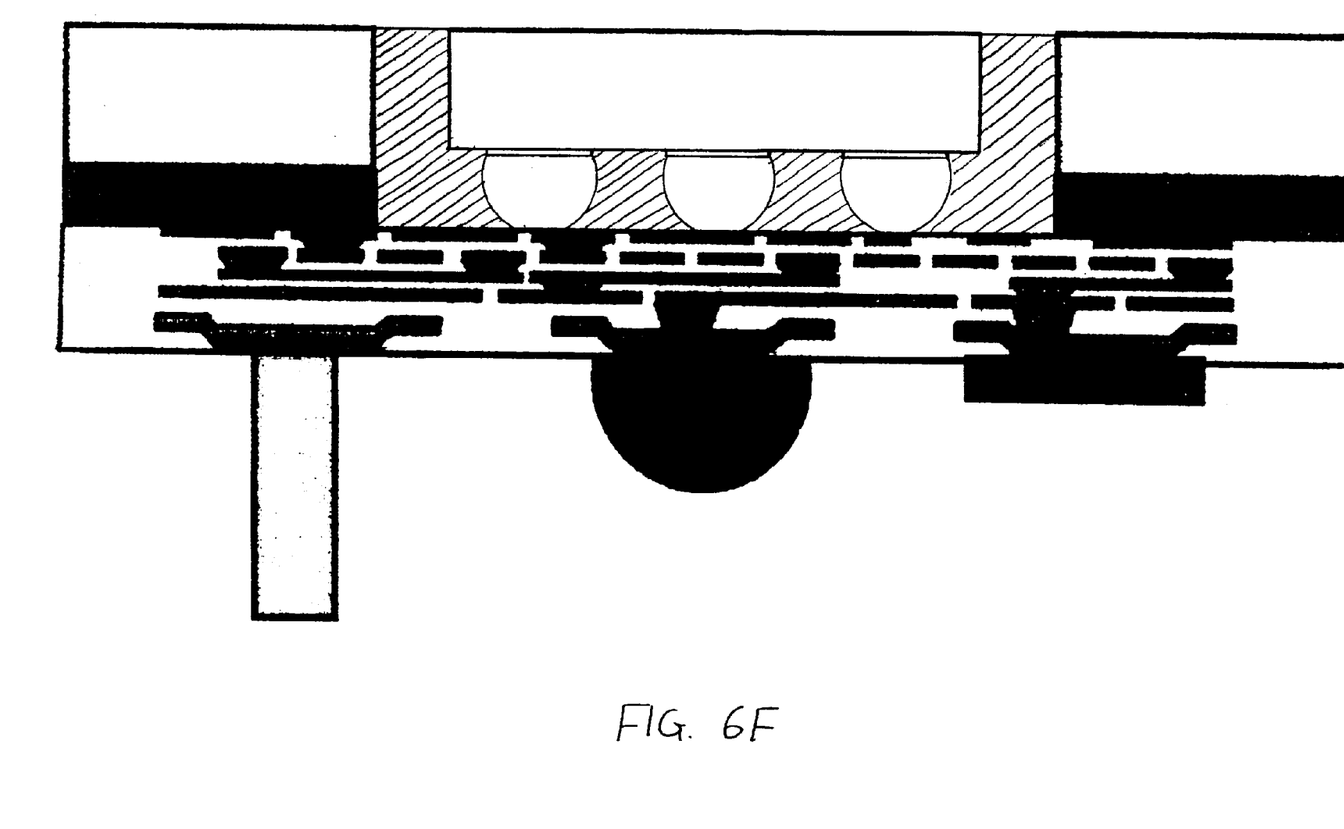

The chip is then joined to the interconnect wiring layer by a conventional C4 chip join process (FIG. 6D). The entire gap between the chip and the stiffener, including any spaces under the chip and around the C4 connectors, is then filled with an organic material 71 (FIG. 6E). This step may be viewed as both a gap fill and C4 underfill process. Finally, as in the first embodiment, the transparent substrate 68 is removed from layer 66 by a laser ablation process, bonding pads 67p are exposed, and appropriate structures (PGA, BGA, C4 or LGA) are attached to the pads for connection to a motherboard (FIG. 6F).

Advantages of the Invention

The present invention provides a process for building an integrated, high density, high-performance chip interconnect system which has several advantages: (1) The use of stud/via connections reduces the pitch of the chip interconnects relative to existing systems; (2) Each chip is surrounded by a stiffener with an adjustable TCE; (3) The total chip/package cost is reduced by an estimated 50%; (4) The chip and the interconnect may be fabricated in parallel; (5) The bottom surface of the interconnect is free of components or structures other than connectors, so that the total area of the integrated module is reduced.

While the present invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method for fabricating an integrated structure including a semiconductor device and connector structures for connecting the semiconductor device to a motherboard, the method comprising the steps of:
    forming a first layer on a plate transparent to ablating radiation, the first layer having a first set of conductors disposed therein, the first set of conductors connecting to bonding pads, the bonding pads being spaced with a first spacing distance in accordance with a required spacing of connections to the motherboard;
    forming a second layer on the semiconductor device, the second layer having a second set of conductors disposed therein connecting to the semiconductor device;
    forming studs on one of the first layer and the second layer, the studs being spaced with a second spacing distance less than the first spacing distance;
    forming a third layer on the one of the first layer and the second layer not having studs thereon;
    forming vias in the third layer, the vias being spaced in accordance with the second spacing distance;
    aligning the studs to the vias;
    attaching the semiconductor device to the first layer, so that the first set of conductors and the second set of conductors are connected through the studs;
    attaching a support structure to the first layer, so that the support structure surrounds the semiconductor device, the support structure having an area corresponding to an area occupied by the bonding pads;
    ablating an interface between the first layer and the plate using ablating radiation transmitted through the plate, thereby detaching the plate; and
    attaching the connector structures to the bonding pads.

2. A method according to claim 1, wherein the connector structures form one of a pin grid array (PGA), a ball grid array (BGA), a C4 array and a land grid array (LGA).

3. A method according to claim 1, wherein said step of attaching the support structure is performed before said step of attaching the semiconductor device and before said ablating step.

4. A method according to claim 1, wherein said step of attaching the support structure is performed after said step of attaching the semiconductor device and before said ablating step.

5. A method according to claim 1, wherein the motherboard is characterized by a thermal coefficient of expansion (TCE), and the support structure is provided with a TCE approximately that of the motherboard.

6. A method according to claim 1, further comprising the step of filling a gap between the semiconductor device and the surrounding support structure.

7. A method according to claim 1, further comprising the step of exposing the bonding pads, before said step of attaching the connector structures.

8. A method according to claim 1, wherein the studs are formed on the first layer, and the first layer is provided with an adhesive layer for bonding to the third layer.

9. A method according to claim 1, wherein the second set of conductors is arranged in a plurality of metal layers, the number of said metal layers being less than a number of layers required for fanout to the bonding pads spaced with the first spacing distance.

10. A method for fabricating an integrated structure including a semiconductor device and connector structures for connecting the semiconductor device to a motherboard, the method comprising the steps of:
    forming a first layer on a plate transparent to ablating radiation, the first layer having a first set of conductors disposed therein, the first set of conductors connecting to bonding pads, the bonding pads being spaced with a first spacing distance in accordance with a required spacing of connections to the motherboard;
    forming a second layer on the semiconductor device, the second layer having a second set of conductors disposed therein connecting to the semiconductor device;
    forming a plurality of C4 connectors on the second layer, the C4 connectors being spaced with a second spacing distance less than the first spacing distance;
    aligning the C4 connectors to the first layer;
    attaching the C4 connectors to the first layer, so that the first set of conductors and the second set of conductors are connected;
    attaching a support structure to the first layer, so that the support structure surrounds the semiconductor device, the support structure having an area corresponding to an area occupied by the bonding pads;
    ablating an interface between the first layer and the plate using ablating radiation transmitted through the plate, thereby detaching the plate; and
    attaching the connector structures to the bonding pads.

11. A method according to claim 10, wherein the connector structures form one of a pin grid array (PGA), a ball grid array (BGA), a C4 array and a land grid array (LGA).

12. A method according to claim 10, wherein said step of attaching the support structure is performed before said step of attaching the C4 connectors and before said ablating step.

13. A method according to claim 10, wherein the motherboard is characterized by a thermal coefficient of expansion (TCE), and the support structure is provided with a TCE approximately that of the motherboard.

14. A method according to claim 10, further comprising the step of filling a gap between the semiconductor device and the support structure and a gap between the semiconductor device and the first layer surrounding the C4 connectors.

15. A method according to claim 10, further comprising the step of exposing the bonding pads, before said step of attaching the connector structures.

16. A method according to claim 10, wherein the second set of conductors is arranged in a plurality of metal layers, the number of said metal layers being less than a number of layers required for fanout to the bonding pads spaced with the first spacing distance.

* * * * *